United States Patent [19]
Oh et al.

[11] Patent Number: 5,853,795
[45] Date of Patent: Dec. 29, 1998

[54] LUMINANT FOR FIELD EMISSION DISPLAY FABRICATED THROUGH PHYSICAL VAPOR DEPOSITION AND METHOD FOR FABRICATING THE SAME

[75] Inventors: Myung Hwan Oh; Yun Hi Lee; Byeong Kwon Ju; Man Ho Song, all of Seoul, Rep. of Korea

[73] Assignee: Korea Institute of Science and Technology, Seoul, Rep. of Korea

[21] Appl. No.: 647,525

[22] Filed: May 15, 1996

[30] Foreign Application Priority Data

Nov. 4, 1995 [KR] Rep. of Korea .................. 1995-39797

[51] Int. Cl.$^6$ .............................. B05D 5/06; C23C 14/00
[52] U.S. Cl. .............................. 427/64; 427/67; 427/162; 427/166; 427/255.2; 427/372.2; 427/464; 427/419.2; 264/192.12; 264/192.26
[58] Field of Search ........................... 427/64, 69, 255.2, 427/255, 162, 166, 372.2, 404, 419.2; 204/192.12, 192.26

[56] References Cited

U.S. PATENT DOCUMENTS

| | | | |
|---|---|---|---|
| 5,356,657 | 10/1994 | Terada et al. .............................. | 427/69 |
| 5,372,839 | 12/1994 | Mikami et al. ............................. | 427/69 |
| 5,397,957 | 3/1995 | Zimmerman ............................. | 427/165 |

OTHER PUBLICATIONS

Gibbons et al., "Further Studies of Multilayered Phosphor Thin Films", 10. 4:129–132, *SID 96 Digest* (1996) (No. mo.).

*Primary Examiner*—Janyce Bell
*Attorney, Agent, or Firm*—Townsend and Townsend and Crew LLP

[57] ABSTRACT

A method for fabricating a luminant for a field emission display fabricated through PVD is disclosed. The method includes the steps of: forming a ZnO:Zn luminescent thin film on a glass substrate through PVD; and forming a conductive thin film on the ZnO:Zn luminescent thin film, to thereby change the luminescence threshold, brightness and luminescent color suitable for the operation characteristics of the emitter in a predetermined range, by controlling the thickness of the luminescent layer, temperature and ambient of heat treatment of the luminant.

15 Claims, 2 Drawing Sheets

LUMINANT FOR FIELD EMISSION DISPLAY FABRICATED THROUGH PHYSICAL VAPOR DEPOSITION AND METHOD FOR FABRICATING THE SAME

BACKGROUND OF THE INVENTION

The present invention relates to a luminant for field emission display (FED) and a method for fabricating the same, and more particularly, to a luminant of FED fabricated through physical vapor deposition (PVD) and a method for fabricating the same, in which a luminescent thin film is formed through PVD method, thereby carrying out a high-clean process, easily controlling the thickness of the luminant, and realizing high-resolution.

A generally used conventional FED roughly has a triode-structure consisting of a cathode, gate and anode. In this structure, electrons emitted from the cathode are controlled by the gate electrode, and accelerated by a potential of the anode, to thereby excite a luminant. By doing so, luminescence occurs. On the other hand, as an improved form of the triode, a diode-structure FED has been proposed, which utilizing a material having a low work function, such as diamond thin film, as an emitter. The diode FED is constructed in such a manner that a thin or thick film-form emitter is formed on a cathode, instead of a tip array. Also, the diode FED has no gate electrode, and consists of a cathode, anode, and luminescent layer. Here, if a luminant for conventional cathode ray tube (CRT) is used as a material of the luminescent layer, it is required that an anode voltage increases above $10^4$ V. However, it is known that this is impossible in case of the FED in which the distance between the cathode and the surface of the luminant is kept below 1 mm.

Accordingly, for development of FED, it is required that a technique for fabricating a luminescent layer capable of providing a high-resolution and high-quality picture necessary for every display device, as well as being luminescent at a low voltage. The characteristics required for the luminant of the FED are excellent luminescence spectrum profile, color purity, and luminous efficiency, and operation at a voltage as low as possible. Also, since a high vacuum should be necessarily kept in terms of operation principles of FED, it is required that a vacuum of initial state is kept, and at the same time, the internal contamination is reduced.

Presently used luminant of FED is formed in a manner that a thickness of several or tens of $\mu$m of luminescent layer is coated on a substrate using a thick-layer technique. Here, the size of particles constructing the luminescent layer should be reduced below 1 $\mu$m with regard to resolution. For this, studies on fabricating ultra-fine particle is briskly carried out. Results of studies for increasing the luminous efficiency of the luminant at a low voltage are disclosed in Journal of Korean electronics engineering society Vol.22, No.2, p.338–345, 1995. In this journal, there are studies on increase of the surface luminous efficacy of electron by increasing the conductivity through heat treatment or adding conductive material to a powder during the formation of the luminescent layer, or reduction of an insensitive layer by surface treatment of the luminescent layer of the luminant.

Here, the surface treatment is to coat a thin conductive layer like aluminum, treatment in a gas ambient for the purpose of cleaning the surface of the luminescent layer to which electrons are injected, or cutting the surface of the luminescent layer by a predetermined thickness using energy. The surface treatment is carried out after the formation of the luminescent layer in order to easily inject electrons into the luminescent layer. The insensitive layer is a portion into which electrons can not pierce due to the surface damage in a predetermined portion caused by collision of electrons with the surface of the luminescent layer, or a portion in which electrons emitted from an emitter tip can not pierce into the luminescent layer but are accumulated due to impurities such as particle or gas which are caused by the collision of electrons.

Since the technique for fabricating the emitter of FED requires high-cleaning semiconductor process, the process in which the luminescent layer is formed by coating powder using the present thick film technique will be phased out. As a result, a process for fabricating the luminescent layer using the thin film technique will be widely used, which is capable of reducing the surface contamination, carrying out high-cleaning process equal to semiconductor process, easily controlling the thickness of the luminescent layer, and realizing high resolution. For this, recently studies on a thin film luminescent layer for FED has been reported, recently. However, these methods use chemical vapor deposition (CVD) or spray.

SUMMARY OF THE INVENTION

It is an object of the present invention to provide a luminant of a FED fabricated by PVD and a method for fabricating the same in which ZnO:Zn luminescent thin film is formed through PVD, thereby carrying out a high-clean process, easily controlling the thickness of the luminant, and realizing high-resolution.

To accomplish the object of the present invention, there is provided a luminant for a field emission display fabricated through PVD including: a glass substrate; and a ZnO:Zn luminescent thin film formed on the glass substrate by a thickness of 200 to 1500 nm.

For the object of the present invention, there is further provided a luminant for a field emission display fabricated through PVD including: a glass substrate; a ZnO:Zn luminescent thin film formed on the glass substrate by a thickness of 200 to 1500 nm; and a conductive thin film formed on the ZnO:Zn luminescent thin film by a thickness of 1 to 20 nm.

To accomplish the object of the present invention, there is further provided a method for fabricating a luminant for a field emission display fabricated through PVD, in which a ZnO:Zn luminescent thin film is formed on a glass substrate through PVD.

For the object of the present invention, there is further provided a method for fabricating a luminant for a field emission display fabricated through PVD, the method including the steps of: forming a ZnO:Zn luminescent thin film on a glass substrate through PVD; and forming a conductive thin film on the ZnO:Zn luminescent thin film.

BRIEF DESCRIPTION OF THE ATTACHED DRAWINGS

The novel features believed characteristic of the invention, as well as other features and advantages thereof, will best be understood by reference to the following detailed description of a particular embodiment, read in conjunction with the accompanying drawings, wherein:

FIG. 1 is a graph showing an XRD analysis result illustrating crystallization of ZnO:Zn luminescent thin film and ZnO:Zn/ITO luminescent thin film, fabricated by PVD, in accordance with the present invention; and FIG. 2 is a graph showing cathode luminescence characteristics measured by injecting electrons accelerated at a high energy into ZnO:Zn luminescent thin film and ZnO:Zn/ITO luminescent thin film having crystallization in FIG. 1.

DETAILED DESCRIPTION OF THE INVENTION

Figure 1:
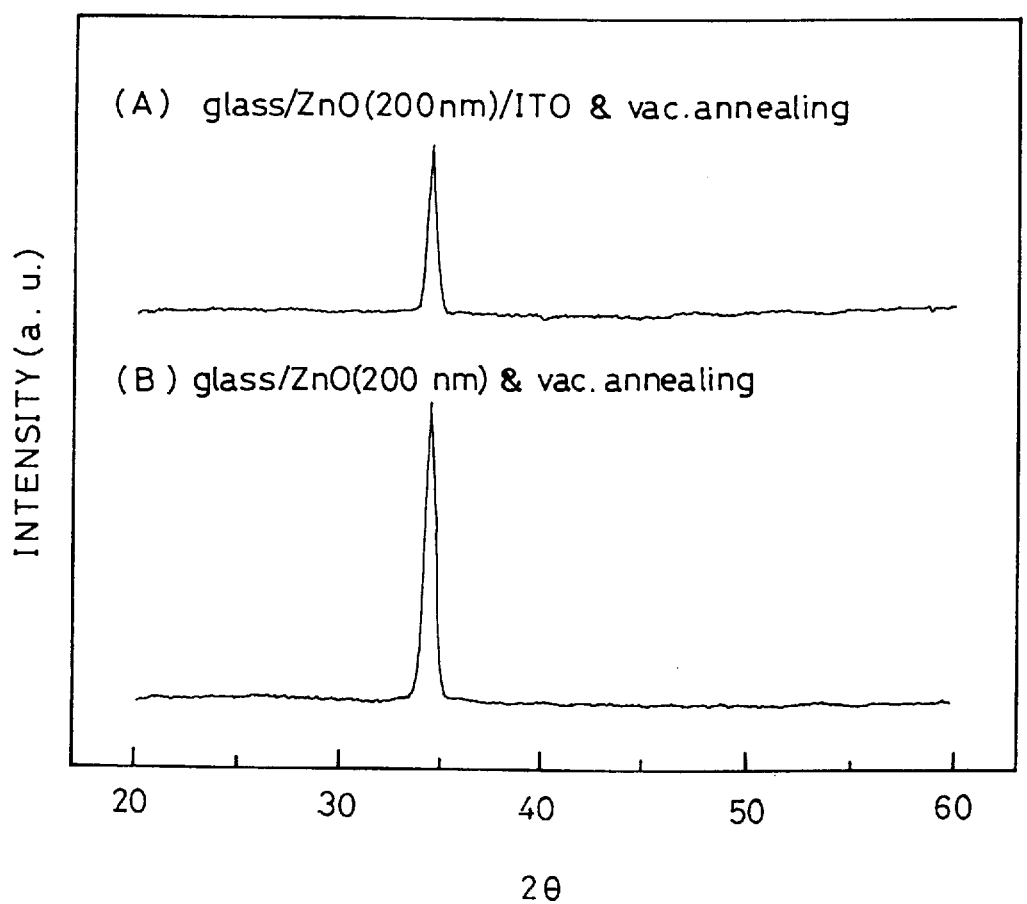

A preferred embodiment of the present invention will be explained below with reference to the accompanying drawings. The present invention forms a ZnO:Zn luminescent thin film having excellent crystallization and luminescence characteristics even a state of a very thin film, using PVD, for example, sputtering or electron beam deposition, in which processes are carried out easily, and the cost for processes is low, as compared with the conventional CVD. The present invention will be explained below in detail with reference to FIG. 1. FIG. 1 is a graph illustrating XRD analysis results showing crystallization of ZnO:Zn luminescent thin film having 200 nm of thickness. FIG. 1A shows a crystallization of the luminescent thin film in case that a ZnO:Zn luminescent thin film is formed on a glass substrate (Corning 7059) by a thickness of 200 to 1500 nm, and then heat treatment is carried out in vacuum, and FIG. 1B shows a crystallization of the luminescent thin film in case that a ZnO:Zn luminescent thin film is formed on the 7059 glass substrate by a thickness of 200 to 1500 nm, and an indium tin oxide (ITO) transparent conductive layer is formed on the ZnO:Zn luminescent thin film in state of a very thin film, for example, by a thickness of 1 to 20 nm, and then heat treatment is carried out in vacuum.

In case of FIG. 1A, a process for fabricating the luminescent thin film will be explained below in detail. First of all, the ZnO:Zn luminescent thin film is formed on the 7059 glass substrate by a thickness of 200 to 1500 nm using the sputtering, one of PVD method, under the conditions of 1 to 100 motor of plasma gas pressure, 10 to 40% of sputtering ambient gas $O_2/Ar$, and the room temperature to 300° C. of the substrate temperature. Then, heat treatment is performed at $10^{-4}$ to $10^{-6}$ torr of vacuum degree for 30 to 60 minutes in order to increase the crystallization of the ZnO:Zn luminescent thin film. Here, it is possible to replace the vacuum heat treatment with electric heat treatment under the ambient of a reducing gas, such as Ar or mixed gas of Ar and $H_2$. As shown in FIG. 1A, even though the thickness of the ZnO:Zn luminescent thin film formed on the 7059 glass substrate is very thin, compared with the thickness of a conventional luminescent screen, the luminescent thin film has an excellent crystallization.

In case of FIG. 1B, a process for fabricating the luminescent thin film will be explained below in detail. First, the ZnO:Zn luminescent thin film is formed on the 7059 glass substrate by a thickness of 200 to 1500 nm using the PVD method, and then ITO transparent conductive layer is coated on the surface of the ZnO:Zn luminescent thin film by a thickness of 1 to 20 nm using the sputtering, under the conditions of 1 to 10 motor of plasma gas pressure, 10 to 40% of sputtering ambient gas $O_2/Ar$, and the room temperature to 300° C. of the substrate temperature. Then, a stack of glass/ZnO:Zn/ITO is heat-treated at $10^{-4}$ to $10^{-6}$ torr of vacuum degree for 30 to 60 minutes. By doing so, the very thin film of ITO is penetrated into the ZnO, and at the same time, crystallization of ZnO:Zn is improved, to thereby obtain the crystallization of FIG. 1B. Here, it is possible to replace the vacuum heat treatment with electric heat treatment under the ambient of a reducing gas, such as Ar or mixed gas of Ar and $H_2$. However, in case that the ITO is coated on the luminescent thin film, and then vacuum heat treatment is carried out, crystallization of the luminescent thin film is reduced, compared with a case that the ITO is not formed shown in FIG. 1A.

Figure 2:
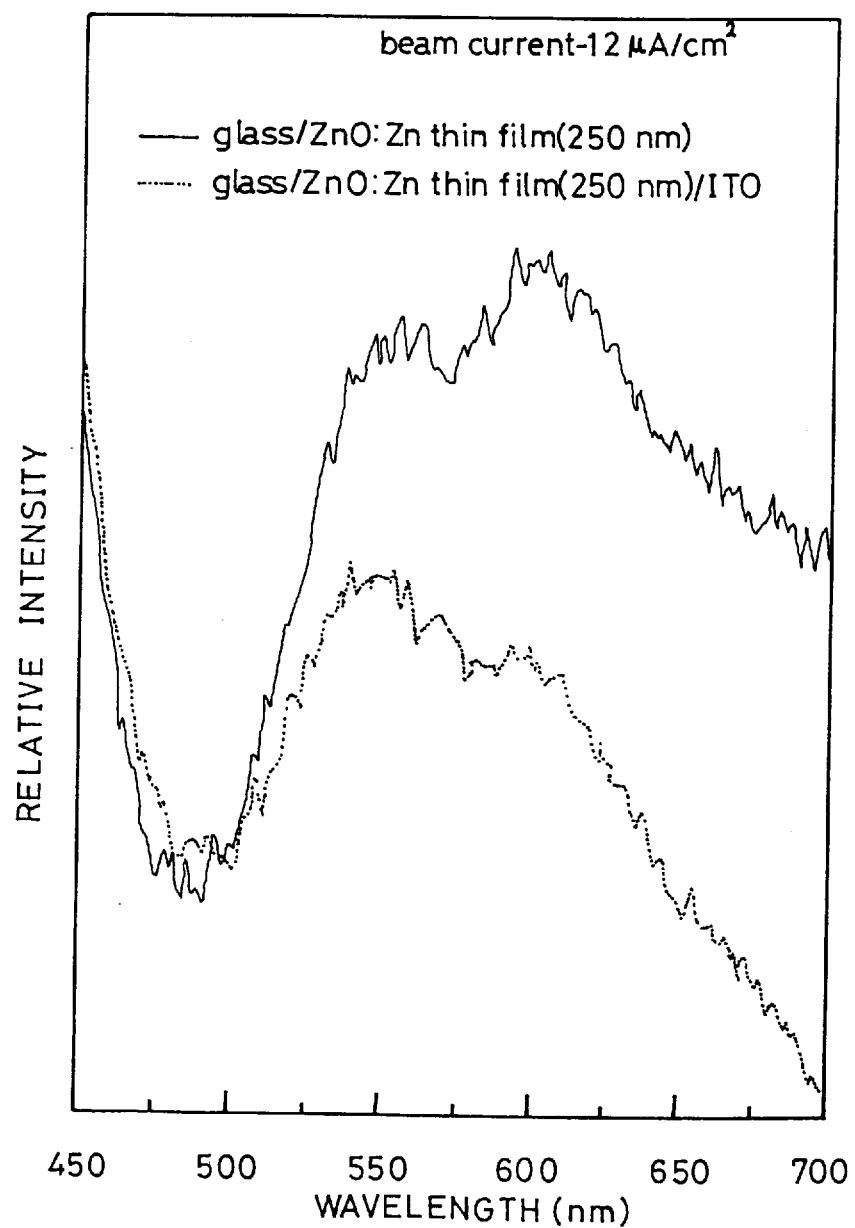

FIG. 2 is a graph showing cathode luminescence measured by injecting electrons accelerated at a high energy into the luminant, for example, glass/Zno:Zn-structure luminant, or glass/ZnO:Zn/ITO-structure luminant, shown in FIG. 1. The luminescence spectrum characteristics of the luminant will be explained below. In case of the ruminant constructed in glass/ZnO:Zn luminescent thin film structure, the peak is shown in a blue-green region, and the luminescence spectrum is widely distributed over the visible ray range to the red region. In case of the luminant constructed in glass/ZnO:Zn luminescent thin film/ITO layer structure, the luminescence spectrum is shifted toward the short wavelength, compared with that of the glass/ZnO:Zn luminescent thin film structure. Thus, it is known that the blue-green wavelength distribution of the ZnO:Zn luminescent thin film is more obvious than that of ZnO:Zn/ITO luminescent thin film.

According to the present invention, it is possible to change the luminescence threshold, brightness and luminescent color suitable for the operation characteristics of the emitter in a predetermined range, by controlling the thickness of the luminescent layer, temperature and ambient of heat treatment of the luminant. Also, the luminescent layer having excellent crystallization even in state of very thin film can be obtained through PVD in which processes are easily carried out, and cost for processes is low. Accordingly, the luminescent layer of the present invention can be applied to a large-area field emission display requiring a high resolution.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A method for fabricating a luminant for a field emission display fabricated through PVD, which comprises the steps of forming a ZnO:Zn luminescent thin film on a glass substrate through PVD, and treating said luminant with heat after said ZnO:Zn luminescent thin film is formed.

2. The method for fabricating a luminant for a field emission display fabricated through PVD as claimed in claim 1, wherein said ZnO:Zn luminescent thin film is formed by a thickness of 200 to 1500 nm.

3. The method for fabricating a luminant for a field emission display fabricated through PVD as claimed in claim 1, wherein said ZnO:Zn luminescent thin film is formed under the conditions of 1 to 10 mtorr of plasma gas pressure, 10 to 40% of sputtering ambient gas $O_2/Ar$, and the room temperature to 300° C. of the substrate temperature.

4. The method for fabricating a luminant for a field emission display fabricated through PVD as claimed in claim 1, wherein said heat treatment is one of vacuum heat treatment and electric heat treatment under the ambient of Ar or mixed gas of Ar and $H_2$.

5. The method for fabricating a luminant for a field emission display fabricated through PVD as claimed in claim 1, wherein said heat treatment is carried out at $10^{-4}$ to $10^{-6}$ torr of vacuum degree for about 30 to 60 minutes.

6. The method for fabricating a luminant for a field emission display fabricated through PVD as claimed in claim 1, wherein said ZnO:Zn luminescent thin film is formed through sputtering or electron beam deposition.

7. A method for fabricating a luminant for a field emission display fabricated through PVD, said method comprising the steps of:

forming a ZnO:Zn luminescent thin film on a glass substrate through PVD; and forming a conductive thin film on said ZnO:Zn luminescent thin film.

8. The method for fabricating a luminant for a field emission display fabricated through PVD as claimed in claim 7, further comprising the step of heat treatment after said conductive thin film is formed.

9. The method for fabricating a luminant for a field emission display fabricated through PVD as claimed in claim 8, wherein said heat treatment is one of vacuum heat treatment, and electric heat treatment under the ambient of Ar or mixed gas of Ar and $H_2$.

10. The method for fabricating a ruminant for a field emission display fabricated through PVD as claimed in claim 8, wherein said heat treatment is carried out at $10^{-4}$ to $10^{-6}$ torr of vacuum degree for about 30 to 60 minutes.

11. The method for fabricating a luminant for a field emission display fabricated through PVD as claimed in claim 7, wherein said ZnO:Zn luminescent thin film is formed by a thickness of 200 to 1500 nm.

12. The method for fabricating a luminant for a field emission display fabricated through PVD as claimed in claim 7, wherein said ZnO:Zn luminescent thin film is formed under the conditions of 1 to 10 mtorr of plasma gas pressure, 10 to 40% of sputtering ambient gas $O_2$/Ar, and the room temperature to 300° C. of the substrate temperature.

13. The method for fabricating a luminant for a field emission display fabricated through PVD as claimed in claim 7, wherein said ZnO:Zn luminescent thin film is formed through sputtering or electron beam deposition.

14. The method for fabricating a luminant for a field emission display fabricated through PVD as claimed in claim 7, wherein said conductive thin film is formed by a thickness of 1 to 20 nm through sputtering.

15. The method for fabricating a luminant for a field emission display fabricated through PVD as claimed in claim 7, wherein said conductive thin film is formed under the conditions of 1 to 10 mtorr of plasma gas pressure, 10 to 40% of sputtering ambient gas $O_2$/Ar, and the room temperature to 300° C. of the substrate temperature.

* * * * *